United States Patent [19]

Oka et al.

[11] Patent Number: 5,959,068
[45] Date of Patent: Sep. 28, 1999

[54] ADHESIVE TAPE FOR ELECTRONIC PARTS AND LIQUID ADHESIVE

[75] Inventors: Osamu Oka; Takeshi Nishigaya; Fumiyoshi Yamanashi, all of Shizuoka, Japan

[73] Assignee: Tomoegawa Paper Co., LTD., Tokyo, Japan

[21] Appl. No.: 09/190,174

[22] Filed: Nov. 12, 1998

Related U.S. Application Data

[62] Division of application No. 08/704,160, Aug. 28, 1996, Pat. No. 5,866,250.

[30] Foreign Application Priority Data

Aug. 31, 1995 [JP] Japan ..................... 7-245149

[51] Int. Cl.⁶ ............... C08G 69/08; C08G 73/10; C08G 75/00; C08G 79/02
[52] U.S. Cl. ............. 528/310; 578/321; 578/322; 156/330.9; 156/331.5
[58] Field of Search ............... 528/310, 321, 528/322; 156/330.9, 331.5

[56] References Cited

U.S. PATENT DOCUMENTS 5,300,627  4/1994  Kunimune et al. .

FOREIGN PATENT DOCUMENTS 5-179224  7/1993  Japan .

Primary Examiner—Nathan M. Nutter
Attorney, Agent, or Firm—McDermott, Will & Emery

[57] ABSTRACT

This invention provide an adhesive tape and a liquid adhesive for electronic parts having sufficient thermal resistance and reliability. The adhesive tape comprises an adhesive layer composed of at least a polyimide comprising the repeating units represented by the formulas (1) and (2), provided on surface of a heat resistance film or a release film:

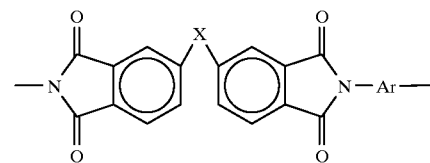

(1)

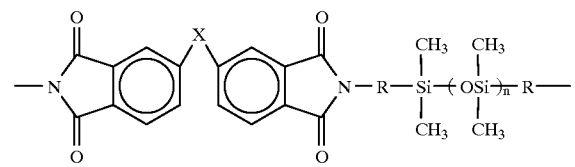

(2)

wherein X is —$SO_2$— and/or —C(=O)—$OCH_2CH_2O$—C(=O)—, Ar is a divalent group containing aromatic rings, and R is an alkylene group having 1 to 10 carbon atoms or —$CH_2OC_6H_4$—, and n means an integer of 1 to 20.

6 Claims, 2 Drawing Sheets

ADHESIVE TAPE FOR ELECTRONIC PARTS AND LIQUID ADHESIVE

This application is a divisional of application Ser. No. 08/704,160 filed Aug. 28, 1996, and now U.S. Pat. No. 5,866,250.

BACKGROUND OF THE INVENTION

1. Field of the Invention

The present invention relates to adhesive tapes for electronic parts to be used for adhering between parts around leadframes making up a semiconductor devices e.g., lead pins, semiconductor chip mounted substrates, heat spreader, semiconductors themselves.

2. Description of the Related Art

Conventionally, adhesive tapes for fixing a leadframe, TAB tapes, etc., are used as adhesive tapes for use in the interior of resin-molded type semiconductor devices. For examples the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturers at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are fixed with the semiconductor chip 1 and an adhesive layer 6 and together with a bonding wire 4, they are molded with a resin 5. In FIG. 3, the device has a construction in which a semiconductor chip 1 is mounted on a die pad 7, electrode 8 is fixed with an adhesive layer 6, the spaces between semiconductor chip 1 and an electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems that the generated gas stains the lead to cause deterioration of the adhesive strength or causes generation of package crack, because of insufficient heat resistance.

The present invention has been made in the light of such situations associated with the prior arts and in order to improve such situations. An object of the present invention is, therefore, to provide an adhesive tape and a liquid adhesive for electronic parts having sufficient heat resistance and reliability.

SUMMARY OF THE INVENTION

An adhesive tape for electronic parts according to the first aspect of the present invention comprises an adhesive layer composed of at least a polyimide comprising at least one of the repeating units represented by the following formulas (1a) and (1b) and at least one of the repeating units represented by the following formulas (2a) and (2b), provided on at least one surface of a heat resistance film:

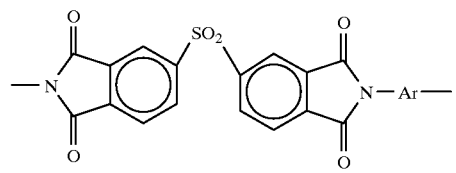

(1a)

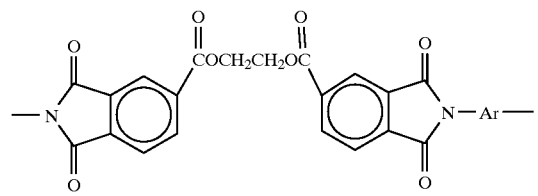

(1b)

wherein Ar represents a divalent group selected from the following formulas containing aromatic rings:

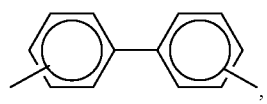

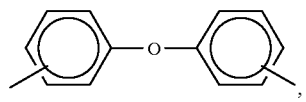

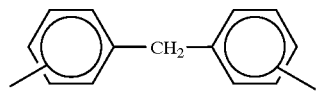

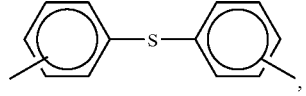

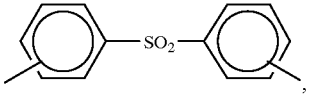

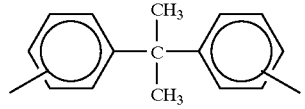

-continued

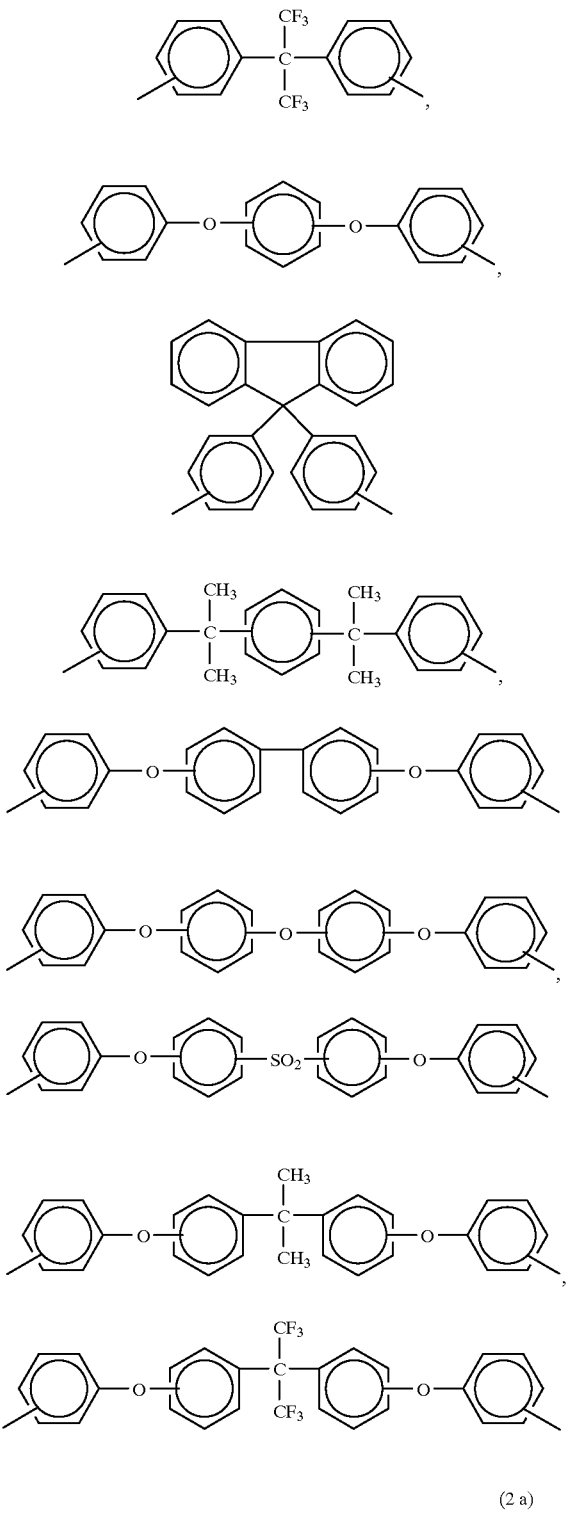

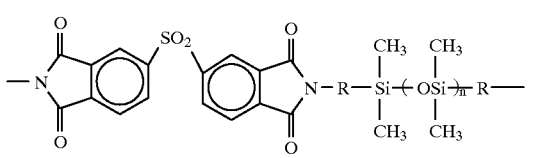
(2a)

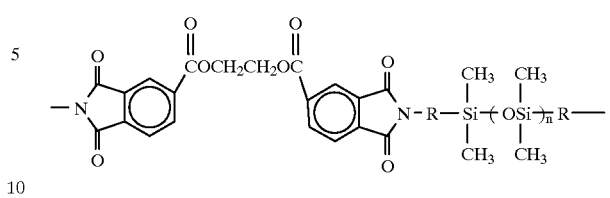
(2b)

wherein R is an alkylene group having 1 to 10 carbon atoms or —$CH_2OC_6H_4$— where —$CH_2$— attaches to Si atom, and n means an integer of 1 to 20.

An adhesive tape for electronic parts according to the second aspect of the present invention comprises an adhesive layer composed of at least a polyimide comprising at least one of the repeating units represented by the above formulas (1a) and (1b) and at least one of the repeating units represented by the above formulas (2a) and (2b), provided on a surface of a release film.

A liquid adhesive for electronic parts according to the present invention comprises at least a polyimide comprising at least one of the repeating units represented by the above formulas (1a) and (1b) and at least one of the repeating units represented by the above formulas (2a) and (2b) dissolved in an organic solvent.

DETAILED DESCRIPTION OF PREFERRED EMBODIMENTS

Figure 1:
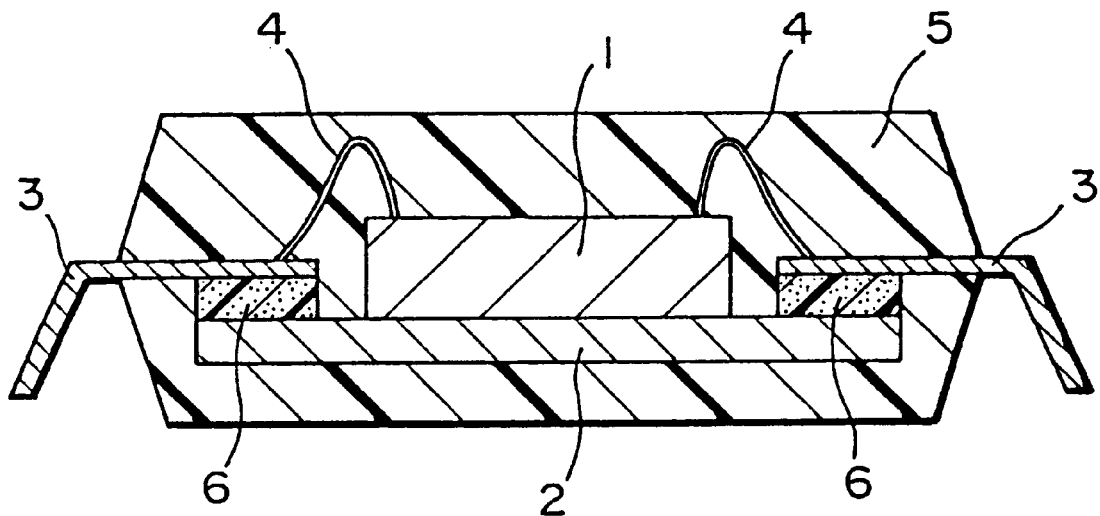
FIG. 1 is a cross-sectional view of one embodiment of a resin-molded type semiconductor device using an adhesive tape of the present invention or a conventional adhesive tape.
Figure 2:
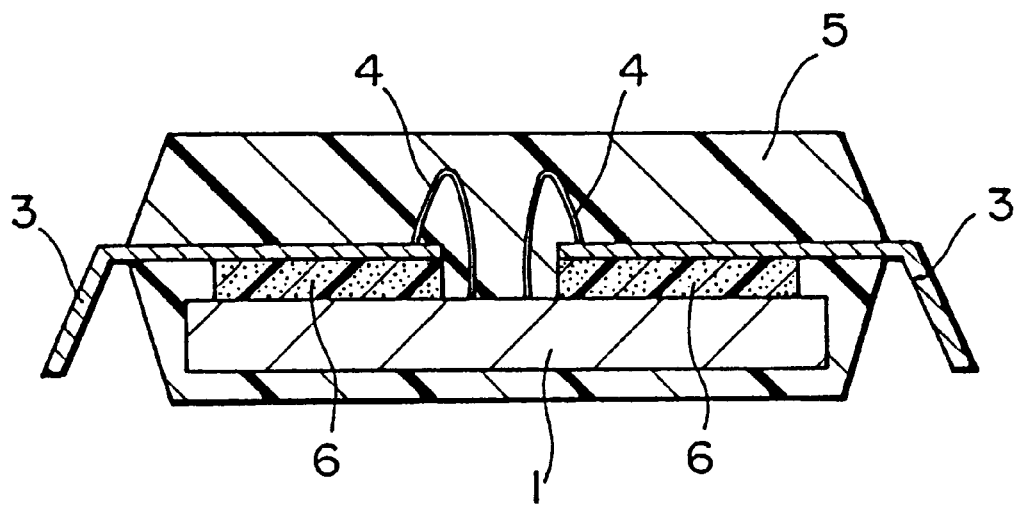
FIG. 2 is a cross-sectional view of another embodiment of a resin-molded type semiconductor device using an adhesive tape of the present invention or a conventional adhesive tape.
Figure 3:
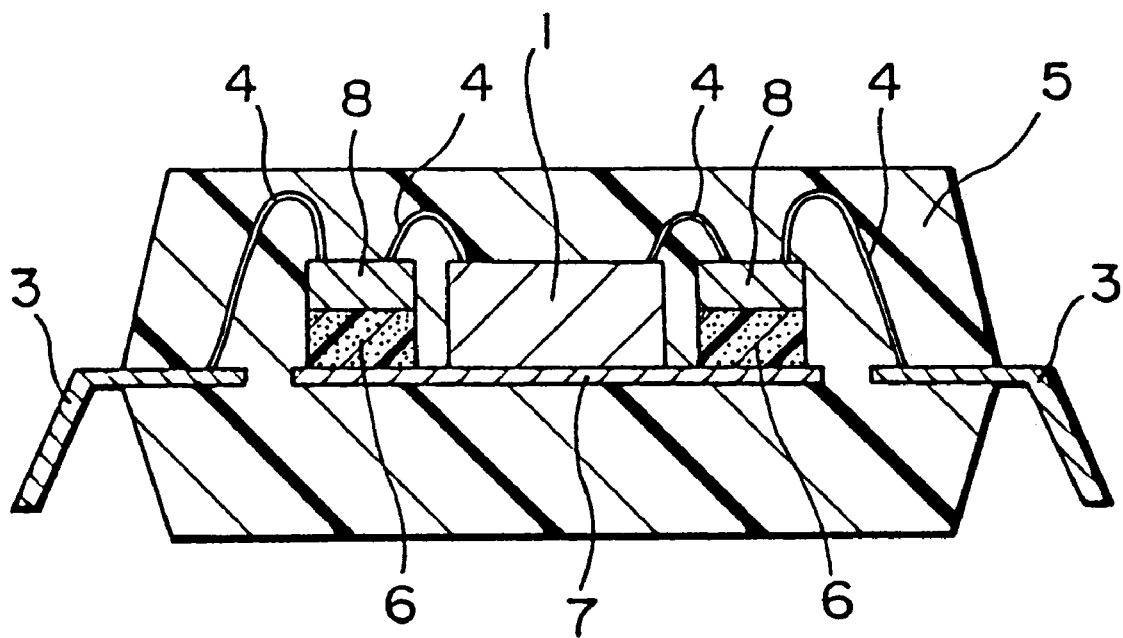
FIG. 3 is a cross-sectional view of still another embodiment of a resin-molded type semiconductor device using an adhesive tape of the present invention or a conventional adhesive tape.

The embodiments of the present invention will now be described in detail.

The polyimide which can be used in the adhesive tape and the liquid adhesive for electric parts of the present invention contains at least one of the repeating units represented by the following formulas (1a) and (1b). In this case, the polyimide contains "at least one of the repeating units represented by the formulas (1a) and (1b)" includes polyimides containing the repeating unit represented by the formula (1a) alone, polyimides containing the repeating unit represented by the formula (1b) alone, and polyimides containing both the repeating units represented by the formulas (1a) and (1b).

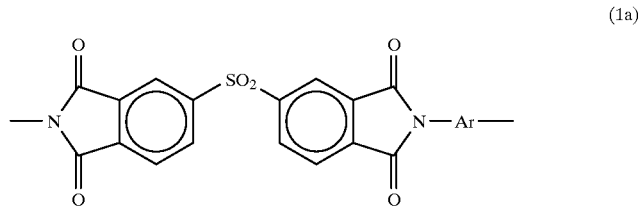

(1a)

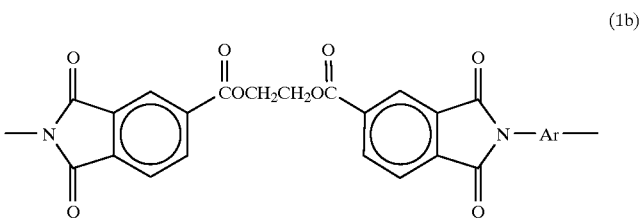

(1b)

wherein Ar is the same meaning as described above.

The polyimide also contains at least one of the repeating units represented by the following formulas (2a) and (2b). In this case, the polyimide contains "at least one of the repeating units represented by the above formulas (2a) and (2b)" includes polyimides containing the repeating unit represented by the formula (2a) alone, polyimides containing the repeating unit represented by the formula (2b) alone, and polyimides containing both the repeating units represented by the formulas (2a) and (2b).

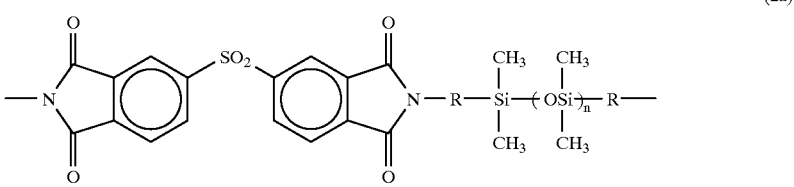

(2a)

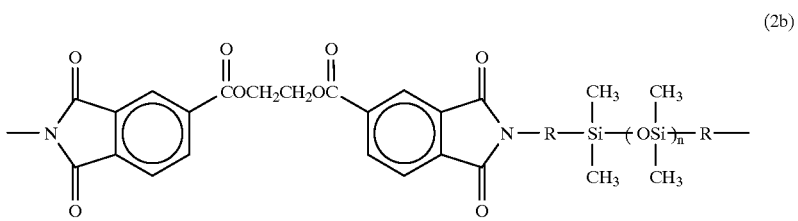

(2b)

wherein R and n are each the same meaning as described above.

In the above described polyimide, the greater the proportion of the repeating units represented by the formulas (1a) and (1b) (referred to as [(1a)+(1b)] herein after) is, the higher the glass transition point becomes, while the greater the proportion of the repeating units represented by the formulas (2a) and (2b) (referred to as [(2a)+(2b)] herein after) is, the lower the glass transition point becomes. Accordingly, it is possible to control a temperature capable of adhering the adhesive by controlling glass transition point of the polyimide.

Accordingly, a preferred polyimide used in the present invention comprises from 95 to 40 mol % of at least one of the repeating units represented by the above formulas (1a) and (1b) and from 5 to 60 mol % of at least one of the repeating units represented by the above formulas (2a) and (2b), which has a number average molecular weight of from 4,000 to 200,000.

Regarding solubility of the above mentioned polyimide, it is greatly influenced by the proportion of [(2a)+(2b)] in the polyimide. When the proportion of it is lower than 5% by mol, the polyimide is soluble in only amide solvents.

The above polyimides to be used in the present invention can be produced according to conventional processes for producing polyimides. In concrete, they can be produced from tetracarboxylic dianhydrides corresponding to the desired repeating units and diamines or diisocyanates corresponding to the desired repeating unit.

Typically, the above polyimide can be produced by reacting tetracarboxylic dianhydrides represented by the following formula (3a) and/or (3b) with a compound represented by the following formula (4) and/or a siloxane compound represented by the following formula (5).

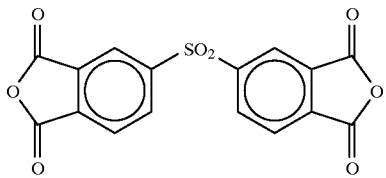
(3a)

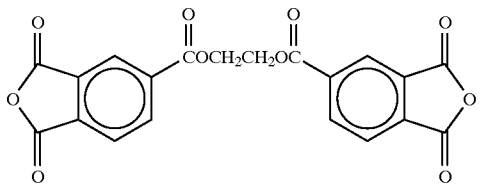
(3b)

$$Y-Ar-Y \quad (4)$$

wherein Ar is the same meaning as described above and Y is an amino group or an isocyanate group.

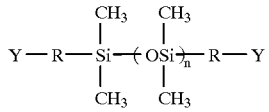
(5)

wherein R and n are each the same meaning as described above and Y is an amino group or an isocyanate group.

Examples of tetracarboxylic dianhyrides represented by the formulas (3a) and (3b) which are used as raw materials for producing the polyimide and form the basic construction of them are 3,3',4,4'-diphenylsulfonetetracarboxylic dianhydride and ethylene glycol bistrimellitate dianhydride respectively.

Examples of the compound represented by the formula (4) include those wherein Ar is a divalent group selected from the above mentioned formulas having aromatic rings. Typical examples of the compound wherein the functional group Y is an amino group include the following diamines: 3,3'-diaminobiphenyl, 3,4'-diaminobiphenyl, 4,4'-diaminobiphenyl, 3,3'-diaminodiphenylmethane, 3,4'-diaminodiphenylmethane, 4,4'-diaminodiphenylmethane, 2,2-(3,3'-diaminodiphenyl)propane, 2,2-(3,4'-diaminodiphenyl)propane, 2,2-(4,4'-diaminodiphenyl)propane, 2,2-(3,3'-diaminodiphenyl)hexafluoropropane, 2,2-(3,4'-diaminodiphenyl) hexafluoropropane, 2,2-(4,4'-diaminodiphenyl)hexafluoropropane, 3,3-oxydianiline, 3,4'-oxydianiline, 4,4'-oxydianiline, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 3,3'-bis(3-aminophenoxy)diphenyl ether, 3,3'-bis(4-aminophenoxy)diphenyl ether, 3,4'-bis(3-aminophenoxy)diphenyl ether, 3,4'-bis(4-aminophenoxy) diphenyl ether, 4,4'-bis(3-aminophenoxy)diphenyl ether, 4,4'-bis(4-aminophenoxy)diphenyl ether, 3,3'-bis(3-aminophenoxy)biphenyl, 3,3'-bis(4-aminophenoxy)biphenyl, 3,4'-bis(3-aminophenoxy)biphenyl, 3,4'-bis(4-aminophenoxy)biphenyl, 4,4'-bis(3-aminophenoxy)biphenyl, 4,4'-bis(4-aminophenoxy) biphenyl, bis[4-(3-aminophenoxy)phenyl]sulfone, bis [4-(4-aminophenoxy)phenyl]sulfone, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis [4-(3-aminophenoxy)phenyl]hexafluoropropane, 2,2-bis[4-(4-aminophenoxy)phenyl]hexafluoropropane, 9,9-bis(3-aminophenyl)fluorene. 9,9-bis(4-aminophenyl)fluorene, and the like. Examples of diisocyanates which are the compounds represented by the formula (4) wherein the functional group Y is an isocyanate group include those exemplified in the above mentioned diamines in which "amino" is replaced by "isocyanate".

Examples of the diamines in the compounds represented by the formula (5) wherein the functional group Y is an amino group include bis(3-aminopropyl) tetramethyldisiloxane, bis(10-aminodecamethylene) tetramethyldisiloxane, tetramer and octamer of dimethylsiloxane having aminopropyl at the terminal, bis(3-aminophenoxymethyl)tetramethyldisiloxane, etc. They can be used as a mixture. Examples of the diisocyanates in the compounds represented by the formula (5) wherein the functional group Y is an isocyanate include those exemplified in the above diamines wherein "amino" is replaced by "isocyanate".

The diisocyanates wherein the functional group Y in the above mentioned formulas (4) and (5) is an isocyanate group can be easily produced by reacting the above exemplified corresponding diamine with phosgene.

The polyimides of the present invention can be produced as follows.

Examples of processes for producing the polyimide using tetracarboxylic dianhyrides and diamines as the raw materials for the polyimide include the following. A process for directly obtaining a polyimide by heating a tetracarboxylic dianhyrides and diamines in an organic solvent, optionally in the presence of a catalyst (in an amount of not more than 20 parts by weight of the reactants) such as tributylamine, triethylamine, or triphenyl phosphite to a temperature of not less than 100° C., and preferably not less than 100° C. A process for obtaining a polyimide by reacting tetracarboxylic dianhyrides with diamines in an organic solvent at a temperature of not more than 100° C. to obtain a polyamic acid which is a precursor of the polyimide, optionally adding a dehydrating such as p-toluenesulfonic acid (in an amount of 1 to 5 times the mol of the tetracarboxylic dianhydride), and then heating the solution to cause an imidation. A process in which the above-mentioned polyamic acid is caused to a ring closing reaction at a relatively low temperature (in a range from room temperature to 100° C.) by adding dehydrating ring closing agent such as an anhydride, e.g., acetic anhydride, propionic anhydride or benzoic anhydride, a carbodiimide compound, e.g., dicylohexylcarbodiimide, and optionally a ring closing catalyst such as pyridine, isoquinoline, imidazole and triethylamine (as for the dehydrating ring closing agent and ring closing catalyst, in an amount of 2 to 10 times the mol of the tetracarboxylic dianhydride).

Examples of the organic solvents used in these reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the product can be produced according to the above-mentioned process for directly obtaining a polyimide. In this case, the reaction temperature is preferably not less than room temperature, and particularly not less than 60° C. The polyimide having a high polymerization degree can be produced by the reaction between equimolar amounts of the tetracarboxylic dianhydrides and the diamines or diisocyanates. If necessary, the molar ration of bismaleimide to diamine or dithiol can be varied in a range of from 11:10 to 10:1 by which the polyimide can be produced.

Since the film formability depends upon molecular weight of the polyimide used in the present invention, the molecular weight can be optimally decided according to desired film formability. When being used in the present invention, polyimide having too low molecular weight is not preferred because film formability in some degree is required in the adhesive layer even in the case of the liquid form and the heat resistance is also lowered. In the present invention, the molecular weight is required to be not less than 4,000. When being used as a thermoplastic adhesive, the adhesion is changed for the worse, if the viscosity during the melting is too high. The molecular weight is a factor for controlling the viscosity during the melting. In the case of the polyimide used in the present invention, the number molecular weight is approximately not more than 400,000. If the molecular weight is higher than this value, there is a high increase in the viscosity making it difficult to be used as an adhesive.

The liquid adhesive of the present invention is produced by dissolving the polyimide in an organic solvent. Examples of the organic solvents used for dissolving the polyimide include various organic solvents such as aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated.

Since the required viscosity and volatility change depending upon the process for applying the liquid adhesive and the base to be applied, the solvent for the liquid adhesive of the present invention can be optimally selected from the above solvents according to the applications.

In the liquid adhesive of the present invention, a filler having a particle size of not more than 1 $\mu$m may be incorporated for the purpose of controlling the characteristics during the adhering. The content of the filler when being incorporated is preferably from 1 to 50% by weight, and more preferably from 4 to 25% by weight, based on the total solid content. If the content of the filler exceeds 50% by weight, the adhesion strength is remarkably lowered. Conversely, if it is less than 1% by weight, no effect of the addition of the filler can be obtained.

Examples of the fillers which can be used are silica, quarts powder, mica, alumina, diamond powder, zircon powder, calcium carbonate, magnesium oxide, fluorine containing resin, and the like.

The adhesive tapes for electronic parts according to the first and the second aspects of the present invention can be produced by using the above liquid adhesive. The adhesive tape of the first aspect is produced by applying the liquid adhesive of the present invention to one side or both sides of a heat resistant films followed by drying the resultant laminate. The adhesive tape of the second aspect is produced by applying the liquid adhesive of the present invention to one side of a release film, followed by drying the resultant laminate.

Examples of the heat resistant films include heat resistance films made of polyimide, polyphenylene sulfide, polyether, polyparabanic acid and polyethylene terephthalate, etc., and composite heat resistant film such as epoxy resin/glass cloth, epoxy resin/polyimide/glass cloth, etc., and polyimide film is particularly preferred.

The heat resistant film which is preferably used has a thickness of from 5 to 150 $\mu$m, and more preferably from 10 to 75 $\mu$m. If the thickness of the heat resistant film is too thick, the operation of punching the adhesive film becomes difficult. Conversely, if it is too thin, the rigidity of the film becomes insufficient.

The adhesive layer formed on a side or both sides of the above-mentioned heat resistant film may have a thickness in a range of from 1 $\mu$m to 100 $\mu$m and preferably from 5 $\mu$m to 50 $\mu$m.

The release film in the adhesive tape of the second aspect of the present invention serves as a temporary base, which has a thickness of from 1 to 200 $\mu$m. Typical examples of the release film used include resin films made of polyethylene, polypropylene, fluorine containing resin, polyethylene terephthalate, polyimide, etc. and paper, and those the surface of which is subjected to releasing treatment with a silicone releasing agent.

The adhesive layer formed on a side of the above-mentioned release film may have a thickness in a range of from 1 $\mu$m to 100 $\mu$m and preferably from 5 $\mu$m to 50 $\mu$m. It is possible to provide on the formed adhesive layer the above-mentioned release film as a protective layer.

As be clear from the results of examination shown hereafter, the liquid adhesive and the adhesive tape for electronic parts of the present invention have sufficient heat resistance and reliability. The liquid adhesive of the present invention can be suitably be used for adhering between parts around leadframes making up a semiconductor device, for example, lead pins, semiconductor-mounted substrate, heat spreader, and semiconductor chips themselves, and the adhesive tape for electronic parts of the present invention can suitably be used as an adhesive tape for the innerlead fix of the leadframe and a TAB tape, etc.

EXAMPLE

The present invention will now be described in greater detail. First, examples for producing the liquid adhesive are shown.

Example 1

Into a flask equipped with a stirrer were introduced 12.34 g (67 mmol) of 3,4'-diaminobiphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone at an iced temperature, and stirring was continued for 1 hour. Consequently, the solution was reacted at room temperature for 3 hours to synthesize a polyamic acid. To the resulting polyamic acid were added 50 ml of toluene and 1.0 g of p-toluenesulfonic acid, the mixture was heated to 160° C. and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 50.0 g (yield: 95%) of a polyimide consisting of the above mentioned repeating units in a proportion of [(1a)+(1b)]:[(2a)+(2b)]=67:33 wherein (1a):(1b)=100:0 and (2a):(2b)=100:0.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 2

Using 13.41 g (67 mmol) of 4,4'-oxydianiline, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 51.0 g (yield: 95%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 3

Using 13.29 g (67 mmol) of 4,4'-diaminodiphenylmethane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 52.0 g (yield: 97%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 4

Using 14.49 g (67 mmol) of 4,4'-diaminodiphenyl sulfide, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 51.0 g (yield: 93%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 5

Using 16.64 g (67 mmol) of 3,3'-diaminodiphenyl sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 51.5 g (yield: 90%) by the same manner as in Example 1.

The IR spectrum measurement of the resultant polyimide showed typical absorption bands of imide at 1715 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 6

Using 15.16 g (67 mmol) of 2,2-bis(4-aminophenyl)propane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a) (1b)=100:0 and (2a):(2b)=100:0 was obtained in an amount of 54.0 g (yield: 97%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 7

Using 22.40 g (67 mmol) of 2,2-bis(4-aminophenyl)hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of

[(1a)+(1b)]:[(2a)+(2b)]=67:33 wherein (1a):(1b)=100:0 and (2a):(2b)=100:0 was obtained in an amount of 60.0 g (yield: 95%) by the same manner as in Example 1.

The IR spectrum measurement of the resultant polyimide showed typical absorption bands of imide at 1721 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 8

Using 19.58 g (67 mmol) of 1,4-bis(4-aminophenoxy) benzene, 8.20 g (33 mmol) of 1,3-bis(3-aminopropyl)-1,1,3,3-tetramethyldisiloxane, 35.83 g (100 mmol) of 3,3', 4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]= 67:33 wherein (1a):(1b)=100:0 and (2a):(2b)=100:0 was obtained in an amount of 58.0 g (yield: 97%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 9

Using 19.58 g (67 mmol) of 1,3-bis(4-aminophenoxy) benzene, 8.20 g (33 mmol) of 2,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]= 67:33 wherein (1a):(1b)=100:0 and (2a):(2b)=100:0 was obtained in an amount of 58.0 g (yield: 97%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 10

Using 23.08 g (67 mmol) of 1,3-bis[1-(4-aminophenyl)-1-methylethyl]benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 62.5 g (yield: 98%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 11

Using 24.68 g (67 mmol) of bis(4-aminophenoxy) biphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]= 67:33 wherein (1a):(1b)=100:0 and (2a):(2b)=100:0 was obtained in an amount of 64.0 g (yield: 98%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 22

Using 25.75 g (67 mmol) of bis(4-aminophenoxy) diphenyl ether, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]= 67:33 wherein (1a):(1b)=100:0 and (2a):(2b)=100:0 was obtained in an amount of 64.0 g (yield: 97%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 13

Using 28.98 g (67 mmol) of bis[4-(4-aminophenoxy) phenyl]sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 94%) by the same manner as in Example 1.

The IR spectrum measurement of the resultant polyimide showed typical absorption bands of imide at 1719 cm$^{-1}$ and 1785 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 14

Using 27.50 g (67 mmol) of 2,2-bis[4-(4-aminophenoxy) phenyl]propane, 8.20 g (33 mmol) of 1,3-bis(3- aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 96%) by the same manner as in Example 1.

The IR spectrum measurement of the resultant polyimide showed typical absorption bands of imide at 1720 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 15

Using 34.74 g (67 mmol) of 2,2-bis[4-(4-aminophenoxy) phenyl]hexafluoropropane, 8.20 g (33 mmol) of 1,3-bis(3-aminopropyl)-1,1,3,3-tetramethyldisiloxans, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 74.0 g (yield: 98%) by the same manner as in Example 1.

The IR spectrum measurement of the resultant polyimide showed typical absorption bands of imide at 1715 cm$^{-1}$ and 1786 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 16

Using 23.35 g (67 mmol) of 9,9-bis(4-aminophenoxy) fluorene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=67:33 wherein (1a):(1b)=100:0 and (2a):(2b)=100:0 was obtained in an amount of 60.5 g (yield: 95%) by the same manner as in Example 1.

The IR spectrum measurement of the resultant polyimide showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 17

Using 13.82 g (75 mmol) of 3,4'-diaminobiphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75: 25 wherein (1a):(1b)=0:100 and (2a):(2b)=0:100 was obtained in an amount of 54.0 g (yield: 94%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 18

Using 15.02 g (75 mmol) of 4,4'-oxydianiline, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 52.0 g (yield: 89%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 19

Using 14.87 g (75 mmol) of 4,4'-diaminodiphenylmethane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 55.0 g (yield: 94%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 20

Using 16.22 g (75 mmol) of 4,4'-diaminodiphenyl sulfide, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 90%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 21

Using 18.63 g (75 mmol) of 3,3'-diaminodiphenyl sulfone, 6.21 g (25 mmol) of 1,3-bis(3-aminopropyl)-1,1,3, 3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 55.5 g (yield: 89%) by the same manner as in Example 1.

The IR spectrum measurement of the resultant polyimide showed typical absorption bands of imide at 1715 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 22

Using 16.97 g (75 mmol) of 2,2-bis(4-aminophenyl)propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 57.0 g (yield: 94%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 23

Using 25.07 g (75 mmol) of 2,2-bis(4-aminophenyl)hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 67. 0 g (yield: 98%) by the same manner as in Example 1.

The IR spectrum measurement of the resultant polyimide showed typical absorption bands of imide at 1721 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 24

Using 21.92 g (75 mmol) of 1,4-bis(4-aminophenoxy)benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0.100 was obtained in an amount of 62.0 g (yield: 95%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined The results are shown in Table 1.

The resultant polyimide was dissolved in tetrahydrofuran so as to be the concentration of 25% by weight to produce a liquid adhesive.

Example 25

Using 21.92 g (75 mmol) of 1,3-bis(4-aminophenoxy)benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]. [(2a)+(2b)]=75:25 wherein (1a):(1b)=0:100 and (2a):(2b)=0:100 was obtained in an amount of 64.0 g (yield: 97%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 26

Using 25.84 g (75 mmol) of 1,3-bis[1-(4-aminophenyl)-1-methylethyl]benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 67.0 g (yield: 96%) by the same manner as in Example 1.

The IR spectrum measurement of the resultant polyimide showed typical absorption bands of imide at 1718 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 27

Using 27.63 g (75 mmol) of bis(4-aminophenoxy)biphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 69.5 g (yield: 98%) by the same manner as in Example 1.

The IR spectrum measurement of the resultant polyimide showed typical absorption bands of imide at 1718 cm$^{-1}$ and 1780 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 28

Using 28.82 g (75 mmol) of bis(4-aminophenoxy)diphenyl ether, 6.21 g (25 mmol) of 1,3-bis(3-aminopropyl)-

1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0.100 was obtained in an amount of 70.0 g (yield: 97%) by the same manner as in Example 1.

The IR spectrum measurement of the resultant polyimide showed typical absorption bands of imide at 1718 $cm^{-1}$ and 1783 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 29

Using 32.08 g (75 mmol) of bis[4-(4-aminophenoxy)phenyl]sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 74.0 g (yield: 97%) by the same manner as in Example 1.

The IR spectrum measurement of the resultant polyimide showed typical absorption bands of imide at 1719 $cm^{-1}$ and 1785 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 30

Using 30.78 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 73.0 g (yield: 98%) by the same manner as in Example 1.

The IR spectrum measurement of the resultant polyimide showed typical absorption bands of imide at 1720 $cm^{-1}$ and 1783 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 31

Using 38.69 g (75 mmol) of 2,2-bis[4-(4-aminophenoxy)phenyl]hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 80.0 g (yield: 97%) by the same manner as in Example 1.

The IR spectrum measurement of the resultant polyimide showed typical absorption bands of imide at 1715 $cm^{-1}$ and 1786 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 32

Using 26.14 g (75 mmol) of 9,9-bis(4-aminophenoxy)fluorene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 66.0 g (yield: 95%) by the same manner as in Example 1.

The IR spectrum measurement of the resultant polyimide showed typical absorption bands of imide at 1720 $cm^{-1}$ and 1780 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 33

Using 20.53 g (50 mmol) of 2,2-bis[4-(4-aminophenoxy)phenyl]propane, 12.43 g (50 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=50:50 wherein (1a):(1b)=100:0 and (2a):(2b)=100:0 was obtained in an amount of 61. 0 g (yield: 93%) by the same manner as in Example 1.

The IR spectrum measurement of the resultant polyimide showed typical absorption bands of imide at 1715 $cm^{-1}$ and 1786 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 34

Using 30.79 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=75:25 wherein (1a):(1b)=100:0 and (2a):(2b)=100:0 was obtained in an amount of 65.0 g (yield: 94%) by the same manner as in Example 1.

The IR spectrum measurement of the resultant polyimide showed typical absorption bands of imide at 1720 $cm^{-1}$ and 1783 $cm^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 35

Using 32.84 g (80 mmol) of 2,2-bis[4-(4-aminophenoxy)phenyl]propane, 4.97 g (20 mmol) of 1,3-bis(3- aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=80:20 wherein (1a):(1b)=100:0 and (2a):(2b)=100:0 was obtained in an amount of 68.0 g (yield: 97%) by the same manner as in Example 1.

The IR spectrum measurement of the resultant polyimide showed typical absorption bands of imide at 1720 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 36

Using 36.95 g (90 mmol) of 2,2-bis[4-(4-aminophenoxy)phenyl]propane, 2.49 g (10 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=90:10 wherein (1a):(1b)=100:0 and (2a):(2b)=100:0 was obtained in an amount of 69.0 g (yield: 97%) by the same manner as in Example 1.

The IR spectrum measurement of the resultant polyimide showed typical absorption bands of imide at 1720 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 37

Using 30.79 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride, 20.53 g (50 mmol) of ethylene glycol bistrimellitate dianhydride and 300 ml of N-methyl-2-pyrrolidone, a polyimide consisting of the repeating units in a proportion of [(1a)+(1b)]:[(2a)+(2b)]=75:25 wherein (1a):(1b)=50:50 and (2a):(2b)=50:50 was obtained in an amount of 68.5 g (yield: 95%) by the same manner as in Example 1.

The IR spectrum measurement of the resultant polyimide showed typical absorption bands of imide at 1715 cm$^{-1}$ and 1786 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 38

Using 30.79 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 8.96 g (25 mmol) of 3,3',4,4'-diphenylsulfonetetracarboxylic dianhydride, 30.77 g (75 mmol) of ethylene glycol bistrimellitate dianhydride and 300 ml of N-methyl-2-pyrrolidone, a polyimide consisting of the repeating units in a proportion of [(1a)+(1b)]:[(2a)+(2b)]=75:25 wherein (1a):(1b)=25:75 and (2a):(2b)=25:75 was obtained in an amount of 69.5 g (yield: 95%) by the same manner as in Example 1.

The IR spectrum measurement of the resultant polyimide showed typical absorption bands of imide at 1715 cm$^{-1}$ and 1786 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 39

Using 30.79 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 26.87 g (75 mmol) of 3,3',4,4'-diphenylsulfonetetracarboxylic dianhydride, 10.26 g (25 mmol) of ethylene glycol bistrimellitate dianhydride and 300 ml of N-methyl-2-pyrrolidone, a polyimide consisting of the repeating units in a proportion of [(1a)+(1b)]:[(2a)+(2b)]=75:25 wherein (1a):(1b)=75:25 and (2a):(2b)=75:25 was obtained in an amount of 66.0 g (yield: 94%) by the same manner as in Example 1.

The IR spectrum measurement of the resultant polyimide showed typical absorption bands of imide at 1715 cm$^{-1}$ and 1786 cm$^{-1}$. The molecular weights glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 40

Using 30.79 g (75 mmol) of 2,2-bis[4-(4-aminophenoxy)phenyl]propane, 9.42 g (25 mmol) of 1,3-bis[(aminophenoxy)methyl]-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]=75:25 wherein (1a):(1b)=100:0 and (2a):(2b)=100:0 was obtained in an amount of 69.0 g (yield: 95%) by the same manner as in Example 1.

The IR spectrum measurement of the resultant polyimide showed typical absorption bands of imide at 1720 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

Example 41

Using 30.79 g (75 mmol) of 2,2-bis[4-(4-aminophenoxy)phenyl]propane, 10.72 g (25 mmol) of aminopropyl terminated dimethylsiloxane tetramer represented by the following formula (5) wherein Y=NH$_2$, R=propylene, n=3:

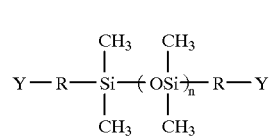

(5)

35.83 g (100 mmol) of 3,3',4,4'-diphenylsulfonetetracarboxylic dianhydride, and 300 ml of N-methyl-2-pyrrolidone, a polyimide consisting of the repeating units in a proportion of [(1a)+(1b)]:[(2a)+(2b)]= 75:25 wherein (1a):(1b)=100:0 and (2a):(2b)=100:0 was obtained in an amount of 67.0 g (yield: 91%) by the same manner as in Example 1.

The IR spectrum measurement of the resultant polyimide showed typical absorption bands of imide at 1712 cm$^{-1}$ and 1783 cm$^{-1}$. The molecular weight, glass transition point and temperature of initiating thermal decomposition of the polyimide were determined. The results are shown in Table 1.

The resultant polyimide was dissolved in tetrahydrofuran so as to be the concentration of 25% by weight to produce a liquid adhesive.

TABLE 1

|  | Number average molecular weight | Glass transition point (°C.) | Temperature of initiating thermal decomposition (°C.) |
|---|---|---|---|
| Ex. 1 | 39,000 | 230 | 452 |
| Ex. 2 | 14,000 | 217 | 456 |
| Ex. 3 | 37,000 | 180 | 450 |
| Ex. 4 | 13,000 | 220 | 451 |
| Ex. 5 | 48,000 | 190 | 450 |
| Ex. 6 | 68,000 | 190 | 450 |
| Ex. 7 | 40,000 | 190 | 455 |
| Ex. 8 | 39,000 | 230 | 450 |
| Ex. 9 | 25,000 | 192 | 450 |
| Ex.10 | 38,000 | 160 | 450 |
| Ex.11 | 53,000 | 232 | 450 |
| Ex.12 | 25,000 | 230 | 453 |
| Ex.13 | 12,000 | 170 | 450 |
| Ex.14 | 26,000 | 211 | 458 |
| Ex.15 | 23,000 | 201 | 451 |
| Ex.16 | 36,000 | 241 | 452 |
| Ex.17 | 29,000 | 190 | 452 |
| Ex.18 | 12,000 | 177 | 456 |
| Ex.19 | 27,000 | 140 | 455 |
| Ex.20 | 13,000 | 180 | 451 |
| Ex.21 | 38,000 | 150 | 453 |
| Ex.22 | 58,000 | 153 | 453 |
| Ex.23 | 38,000 | 149 | 455 |
| Ex.24 | 29,000 | 190 | 453 |
| Ex.25 | 15,000 | 152 | 454 |
| Ex.26 | 28,000 | 130 | 453 |
| Ex.27 | 43,000 | 182 | 452 |
| Ex.28 | 22,000 | 190 | 453 |
| Ex.29 | 11,000 | 134 | 451 |
| Ex.30 | 22,000 | 171 | 448 |
| Ex.31 | 21,000 | 161 | 454 |
| Ex.32 | 26,000 | 201 | 455 |
| Ex.33 | 23,000 | 180 | 451 |
| Ex.34 | 45,000 | 226 | 465 |
| Ex.35 | 46,000 | 236 | 464 |
| Ex.36 | 48,000 | 248 | 460 |
| Ex.37 | 34,000 | 199 | 458 |
| Ex.38 | 31,000 | 183 | 455 |
| Ex.39 | 43,000 | 220 | 465 |
| Ex.40 | 44,000 | 230 | 455 |
| Ex.41 | 43,000 | 180 | 440 |

In the above Table 1, the measurement of the molecular weight of polyimides was carried out using tetrahydrofuran as an eluent and Shodex 80M×2 as a column. Value of the molecular weight is a number average molecular weight which is calculated as polystyrene. The glass transition point was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

Example 42

A liquid adhesive was obtained by mixing 60 parts by weight of the liquid adhesive obtained in Example 1 with 40 parts by weight of the liquid adhesive obtained in Example 10.

Example 43

A liquid adhesive was obtained by mixing 60 parts by weight of the liquid adhesive obtained in Example 16 with 40 parts by weight of the liquid adhesive obtained in Example 10.

Example 44

A liquid adhesive was obtained by mixing 50 parts by weight of the liquid adhesive obtained in Example 33 with 50 parts by weight of the liquid adhesive obtained in Example 36.

Example 45

A liquid adhesive was obtained by mixing 80 parts by weight of the liquid adhesive obtained in Example 33 with 20 parts by weight of the liquid adhesive obtained in Example 36.

Example 46

A liquid adhesive was obtained by mixing 10 parts by weight of alumina filler (produced by Showa Denko K.K.; particle size: 0.05 μm) with 100 parts by weight of the liquid adhesive obtained in Example 10 to disperse therein.

Example 47

A liquid adhesive was obtained by mixing 10 parts by weight of alumina filler (produced by Showa Denko K.K.; particle size: 0.05 μm) with 100 parts by weight of the liquid adhesive obtained in Example 14 to disperse therein.

Example 48

A liquid adhesive was obtained by mixing 10 parts by weight of alumina filler (produced by Showa Denko K.K.; particle size: 0.05 μm) with 100 parts by weight of the liquid adhesive obtained in Example 34 to disperse therein.

Example 49

A liquid adhesive was obtained by mixing 10 parts by weight of silica filler (produced by Arakawa Chemical Industries Ltd.; particle size: 0.07 μm) with 100 parts by weight of the liquid adhesive obtained in Example 10 to disperse therein.

Example 50

A liquid adhesive was obtained by mixing 10 parts by weight of silica filler (produced by Arakawa Chemical Industries Ltd.; particle size: 0.07 μm) with 100 parts by weight of the liquid adhesive obtained in Example 14 to disperse therein.

Example 51

A liquid adhesive was obtained by mixing 10 parts by weight of silica filler (produced by Arakawa Chemical Industries Ltd.; particle size: 0.07 μm) with 100 parts by weight of the liquid adhesive obtained in Example 34 to disperse therein.

TABLE 2

| | Number average molecular weight | Glass transition point (°C.) | Temperature of initiating thermal decomposition (°C.) |
|---|---|---|---|
| Ex.42 | — | 200 | 440 |
| Ex.43 | — | 210 | 440 |
| Ex.44 | — | 215 | 440 |
| Ex.45 | — | 195 | 440 |
| Ex.46 | 38,000 | 160 | 450 |
| Ex.47 | 26,000 | 211 | 458 |
| Ex.48 | 45,000 | 226 | 465 |
| Ex.49 | 38,000 | 160 | 450 |
| Ex.50 | 26,000 | 211 | 458 |
| Ex.51 | 45,000 | 226 | 465 |

In the above table, measurements of each value were carried out by the same manner as described above. Since the symbol "–" means a mixture of two polyimides, the number average molecular weight is not shown in the table.

Comparative Example 1

A nylon-epoxy adhesive (TORESIME FS-410, produced by Teikoku Chemical Industry CO., Ltd.) (solid content: 20%; solvent isopropyl alcohol:methyl ethyl ketone=2:1) was prepared.

Comparative Example 2

A 20% by weight solution of polyimide varnish (Lark TPI, produced by MITSUI TOATSU CHEMICALS INC.) in N-methyl-2-pyrrolidone was prepared.

Production of Adhesive Tape 1

Each of the liquid adhesives obtained from Examples 1 to 51 was applied to both sides of a polyimide film, and dried in a hot air circulating oven at 150° C. for 5 minutes to produce an adhesive tape. The application was controlled so as to form an adhesive layer having a thickness of 20 µm.

Production of Adhesive Tape 2

Each polyimide obtained in Examples 1 to 41 was dissolved in a solvent mixture of N-methyl-2-pyrrolidone and xylene (90:10) so as to be a concentration of 20% by weight to produce a liquid adhesive. Each of the resultant liquid adhesives was applied both sides of a polyimide film, and dried in a hot air circulating oven at 180° C. for 10 minutes to produce an adhesive tape. The application was controlled so as to form an adhesive layer having a thickness of 20 µm.

Production of Adhesive Tape 3

Each polyimide obtained in Examples 1 to 41 was dissolved in a solvent mixture of N,N-dimethylacetamide and toluene (95:5) so as to be a concentration of 20% by weight to produce a liquid adhesive. Each of the resultant liquid adhesives was applied to both sides of a polyimide film, and dried in a hot air circulating oven at 180° C. for 5 minutes to produce an adhesive tape. The application was controlled so as to form an adhesive layer having a thickness of 20 µm.

Production of Comparative Adhesive Tape 1

The liquid adhesive obtained from Comparative Example 1 was applied to both sides of a polyimide films and dried in a hot air circulating oven at 150° C. for 15 minutes to produce an adhesive tape. The application was controlled so as to form an adhesive layer having a thickness of 20 µm.

Production of Comparative Adhesive Tape 2

The liquid adhesive obtained from Comparative Example 2 was applied to both sides of a polyimide film, and dried in a hot air circulating oven at 250° C. for 120 minutes, and then 250° C. for 60 minutes to produce an adhesive tape. The application was controlled so as to form an adhesive layer having a thickness of 20 µm.

Assembling of Leadframe

The leadframe used in a semiconductor package as shown in FIG. 1 was assembled according to the following procedures under conditions shown in the Table 3.

(a) Punch Die of Adhesive Tape

The adhesive tape was subjected to punch dying by mold.

(b) Pre-attachment of Adhesive Tape

A metal plane was placed on a hot plate, and the tape punched out in a ring form was pressed onto the plane by means of a metal rod to be pre-attached.

(c) Assembling of Leadframe

The metal plane to which the adhesive tape had been pre-attached in the above stage and a leadframe were positioned, and heated and pressed on a hot plate heated under the conditions shown in Table 3 to adhere the leadframe and the plane via the adhesive tape.

(d) Curing of Adhesive Tape

In a hot-air circulating oven whose atmosphere was substituted by nitrogen, the adhesive tape was cured on the leadframe assembled in the above three stages under the conditions described in Table 3.

TABLE 3

| | Name of Operation | | |
|---|---|---|---|
| Adhesive tape | Pre-attachment of Adhesive Tape | Assembling of Leadframe | Curing of Adhesive Tape |
| Adhesive Tapes 1 and 2 using adhesives of Examples 1–49 | 200° C./1 sec. /4 kgf/cm² | Glass transition point of each resin + 80° C./1 sec./4 kgf/cm² | None |
| Comparative Adhesive tape 1 | 80° C./2 sec. /4 kgf/cm² | 120° C./2 sec. /4 kgf/cm² | 150° C./3 hrs. |
| Comparative Adhesive tape 2 | 350° C./10 sec. /4 kgf/cm² | 350° C./15 sec. /20 kgf/cm² | None |

Assembling of Semiconductor Package

Thereafter, the produced leadframe was used to assemble a package according to the following procedures. The reason why the conditions of curing were different at the time of assembling the leadframe is that the characteristics of the adhesives are different from each other. Here, optimum conditions for each adhesive were selected, and the adhesive was cured based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cuttings solder plating on the outer leads, etc., the packaging was finished.

The Results of Evaluations of Adhesive Tapes and Semiconductor Packages (a) Oxidization of Leadframe The evaluation of whether or not the oxidization took place during curing the adhesive was visually determined by observing the color change on the surface of the leadframe.

As a result, since the Adhesive Tapes 1 and 2 of the present invention could be taped at a low temperature, no oxidation occurred, but in the case of the Comparative Adhesive Tape 2 requiring a high adhesion temperature, the color change was observed, indicating that the leadframe was oxidized.

(b) Adhesion Strength

A 90° peel strength of 10 μm wide tape at room temperature was measured after the Adhesive Tape was adhered (taped) onto a copper plate under the condition shown in Table 3.

As a result, the Adhesive Tapes 1 and 2 of the present invention were found to have a strength ranging from 35–50 g/10 mm, while the Comparative Adhesive Tape 1 had the strength of 2–4 g/10 mm, and that of the Comparative Adhesive Tape 2 had the strength of 10–40 g/10 mm, the last value having a large variation.

(c) Void

Whether or not the voids formed when the adhesive was cured was within the level problematic for a practical use was visually evaluated by means of a microscope.

As a results in the Adhesive Tapes 1 and 2 of the present inventions no void could be founds whereas in the Comparative Adhesive Tapes 1, formation of voids was found.

(d) Processability

Handlings (curl, feedability, etc.) when the adhesive tapes were used in order to assemble leadframes, and the surface tackiness of the adhesive tapes were evaluated.

As a result, the Adhesive Tapes 1 and 2 of the present invention was found to have good handling abilities, and that no tacking occurred on the surfaces, but the Comparative Adhesive Tape 2 was found to be problematic in handling abilities.

(e) Wire Bondability

In the assembling of the package, the wire bondability onto the leadframe when wire bonding with the gold wire was determined.

As a result, in the case of using the Adhesive Tapes 1 and 2 of the present invention, no bonding defect was observed in the tests for 832 pins. On the other hand, in the case of Comparative Adhesive Tape 11 bonding defects were observed in 123 of the 832 pins, indicating that the gold wire bonding could not be done with sufficient strength.

(f) Evaluation of Semiconductor Packages

The packages obtained as described above were tested using the PCBT Test (Pressure Cooker Biased Test). The test was carried out at 5 V of applied voltage at 121° C. at 2 atmospheres and at 100% relative humidity. As a result, in the case of the Adhesive Tapes 1 and 2 of present invention, no shorting took place even after 1,000 hours.

As is clear from the results described above, in the case of the adhesive tapes for electronic parts of the present invention, the semiconductor package can be produced in a good manner. In contrast, the adhesive tapes using adhesives of Comparative Examples are not suitable for manufacturing electronic parts, because there are problems in that oxidation of leadframe occurs, the conditions for adhering are not suitable for assembling the leadframe, and the wire bonding of gold wire cannot be carried out.

We claim:

1. A liquid adhesive for electronic parts which comprises at least a polyimide resin comprising at least one of the repeating units represented by the formulas (1a) and (1b) and at least one of the repeating units represented by the formulas (2a) and (2b) dissolved in an organic solvent:

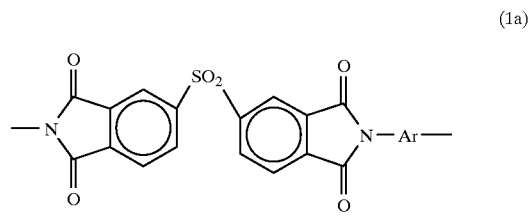

(1a)

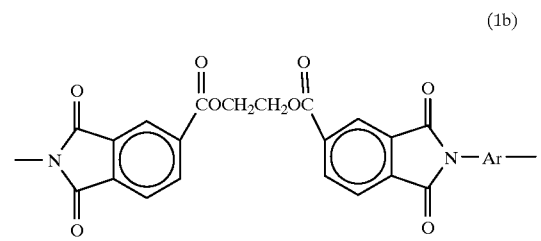

(1b)

wherein Ar represents a divalent group selected from the following formulas containing aromatic rings:

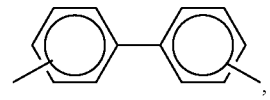

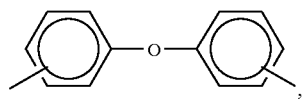

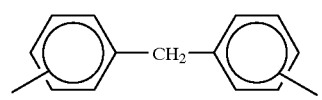

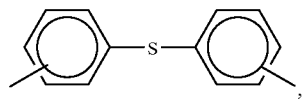

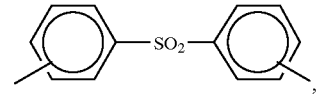

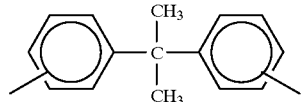

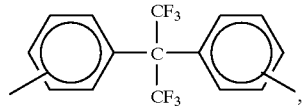

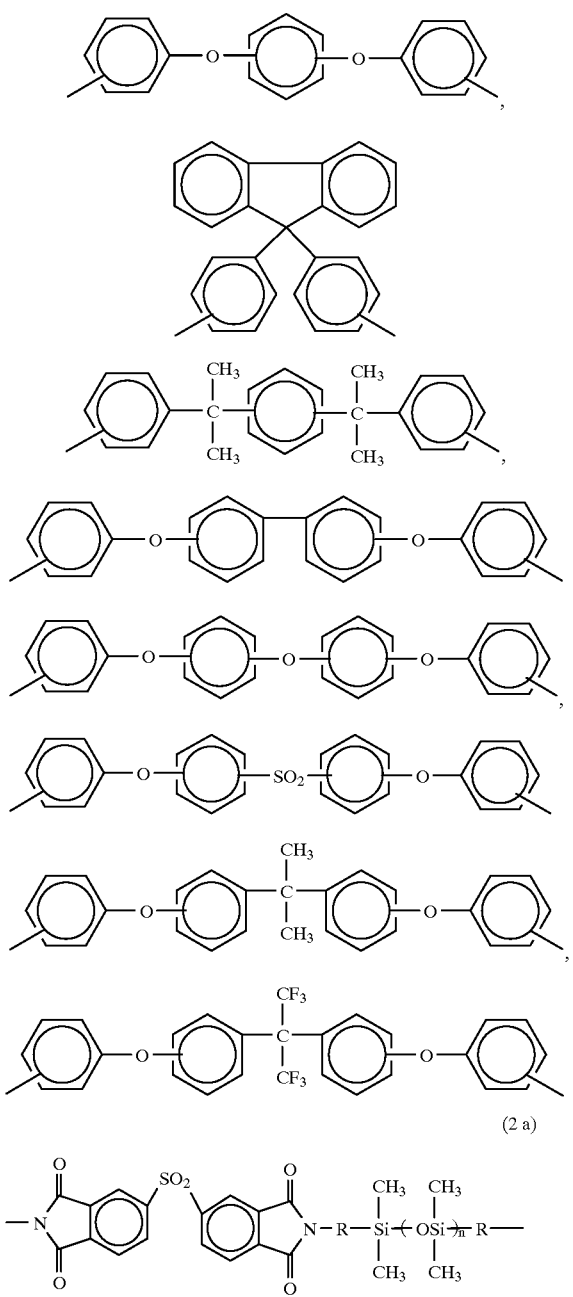

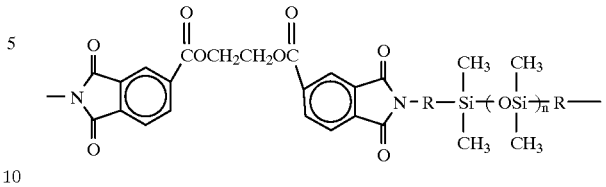

wherein R is an alkylene group having 1 to 10 carbon atoms or —CH₂OC₆H₄—, and n means an integer of 1 to 20.

2. A liquid adhesive for electronic parts as claimed in claim 1, wherein the adhesive layer contains a filler having a particle size of not more than 1 μm in an amount of from 1 to 50% by weight.

3. A liquid adhesive for electronic parts as claimed in claim 1, wherein the proportion of the repeating units represented by the above formulas (1a) and (1b) is from 95 to 40 mol % and the proportion of the repeating unit represented by the above formulas (2a) and (2b) is from 5 to 60 mol %.

4. A liquid adhesive for electronic parts as claimed in claim 1, wherein the polyimide comprises the repeating units represented by the formulas (1a) and (1b) and the repeating unit represented by the above formula (2a).

5. A liquid adhesive for electronic parts as claimed in claim 1, wherein the polyimide comprises the repeating units represented by the formulas (1a) and (1b) and the repeating unit represented by the above formula (2b).

6. A liquid adhesive for electronic parts as claimed in claim 1, wherein the polyimide comprises the repeating units represented by the formulas (1a) and (1b) and the repeating units represented by the above formulas (2a) and (2b).

* * * * *